United States Patent [19]

Hobbs

[11] Patent Number: 4,922,411
[45] Date of Patent: May 1, 1990

[54] MEMORY CELL CIRCUIT WITH SUPPLEMENTAL CURRENT

[75] Inventor: James B. Hobbs, Minneapolis, Minn.

[73] Assignee: Atmel Corporation, San Jose, Calif.

[21] Appl. No.: 290,386

[22] Filed: Dec. 27, 1988

[51] Int. Cl.$^5$ .................. G11C 11/40; G11C 7/00
[52] U.S. Cl. .................................. 365/155; 365/174
[58] Field of Search ............. 365/189.01, 154, 155, 365/174, 190, 205, 188; 357/43

[56] References Cited

U.S. PATENT DOCUMENTS

| | | | | |
|---|---|---|---|---|
| 4,376,985 | 3/1983 | Isogai | ............... | 365/155 |
| 4,419,745 | 12/1983 | Toyoda et al. | ............... | 365/174 |
| 4,754,430 | 6/1988 | Hobbs | ............... | 365/155 |

FOREIGN PATENT DOCUMENTS 0142266  5/1985  European Pat. Off. ............ 365/188

OTHER PUBLICATIONS

IBM Technical Disclosure Bulletin, vol. 28, No. 9, Feb. 1986, "Memory Cells With NPN Couplings".

Primary Examiner—Stuart N. Hecker
Assistant Examiner—Alyssa H. Bowler

[57] ABSTRACT

A memory cell circuit with a pair of load bipolar transistors and a pair of control bipolar transistors, and with a pair of supplemental transistors providing current shunts.

9 Claims, 2 Drawing Sheets

MEMORY CELL CIRCUIT WITH SUPPLEMENTAL CURRENT

The Government has rights in this invention pursuant to Contract No. F33615-84-C-1500 awarded by the Department of the Air Force.

BACKGROUND OF THE INVENTION

The present invention relates to memory cell circuits for random access memories and, more particularly, to memory cell circuits based on bipolar transistors.

Digital memories of various kinds are used extensively in computers and computer system components, digital processing systems, and the like. This increasing use has been made possible primarily by the rapid shrinking in size of monolithic integrated circuits that has been occurring in recent years. Such shrinkage has allowed an increase in the density of circuits provided in monolithic integrated circuit chips, and this has both improved performance and reduced cost.

Memory cell circuits based on bipolar transistors have been used primarily because of the speed of operation obtainable with such transistors. However, the advent of merged complementary bipolar transistor structures has permitted fabricating bipolar transistor memories also having a substantial density of memory cells in a monolithic integrated circuit chip.

A typical merged transistor circuit for a memory cell has a pair of pnp bipolar transistors serving as loads, and has a further pair of cross-coupled npn bipolar transistors serving as the control transistors for operating the memory cell circuit. The emitters of the pnp bipolar transistors are connected to the memory system word line interconnection extending from the address decoding circuitry, and the emitters of the npn bipolar transistors are connected to the memory system standby line interconnection also extending from the same decoding circuitry. Each control transistor has its collector connected to the other's base and to both the base of one pnp load transistor and to the collector of the other pnp load transistor.

In those situations in which the memory cell is not to have information stored therein or retrieved therefrom, the cell is in the standby mode of operation and reduced voltages are applied to both the word line and the standby line to which the cell is connected. An increase in the voltages of these two lines occurs selectively, occurring in response to an appropriate address being presented to the memory indicating the row of memory cells in which the cell of interest is located. This increase in voltage will permit storing or retrieving information from the memory cell.

A bit line is typically connected through a switching device of a suitable kind to the collector of each control transistor. The arrangement is configured in such a manner so as to permit storing information in the memory cell through these bit lines or retrieving information therefrom over these bit lines.

In operation, one of the control npn bipolar transistors is in the "on" condition, as is its pnp bipolar transistor load. The other control npn bipolar transistor is in the "off" condition, as is also its pnp transistor load. Current thus flows through one side, and not the other, to thereby set the state of the memory cell and so the information it contains.

Such a memory cell has a drawback, however, because the two transistors in the "on" condition are as a result each operated so as to be well into the saturation region thereof. This results in the storage of charge carriers in each of the base regions thereof, and so the switching time of such a pair of transistors from the "on" condition to the "off" condition is slowed. Such a slowing of switching time means that information cannot be stored in the memory cell as quickly as it might otherwise be, thus slowing the operation of the memory. Slowing of the operation of the memory, in turn, slows the operation of the system in which the memory is used.

One improvement that can be made in such a memory cell is to have each of the pnp transistors provided with a second collector connected to its base. This in effect then provides current from both the base and the collector of the pnp load transistor to the collector of the npn control transistor rather than from just base of this pnp load transistor. This reduces the base current required from the pnp load transistor, and correspondingly limits the saturation of the pnp load transistor. Since this pnp bipolar transistor is then operated drawing less base current therethrough, there is less current flowing out of the other collector thereof into the base of its control npn bipolar transistor thereby reducing its saturation.

This reduction in saturation aids in permitting the memory cell to operate faster. However, there still remains operation of the "on" condition transistors in substantial saturation, and so there is a desire to reduce such saturation further to permit a greater increase in the rapidity of operation of the memory cell.

SUMMARY OF THE INVENTION

The present invention provides a memory cell circuit with a pair of load bipolar transistors and a pair of control bipolar transistors as described above. In addition, a pair of supplemental transistors is provided having the emitters thereof connected to the collectors of the control transistors and the collectors thereof connected to the memory system word line. The bases of the supplemental transistors are connected to the bases of the control transistors. Each load transistor may also have a second collector which is connected to the base thereof.

DETAILED DESCRIPTION OF THE PREFERRED EMBODIMENTS

Figure 1:
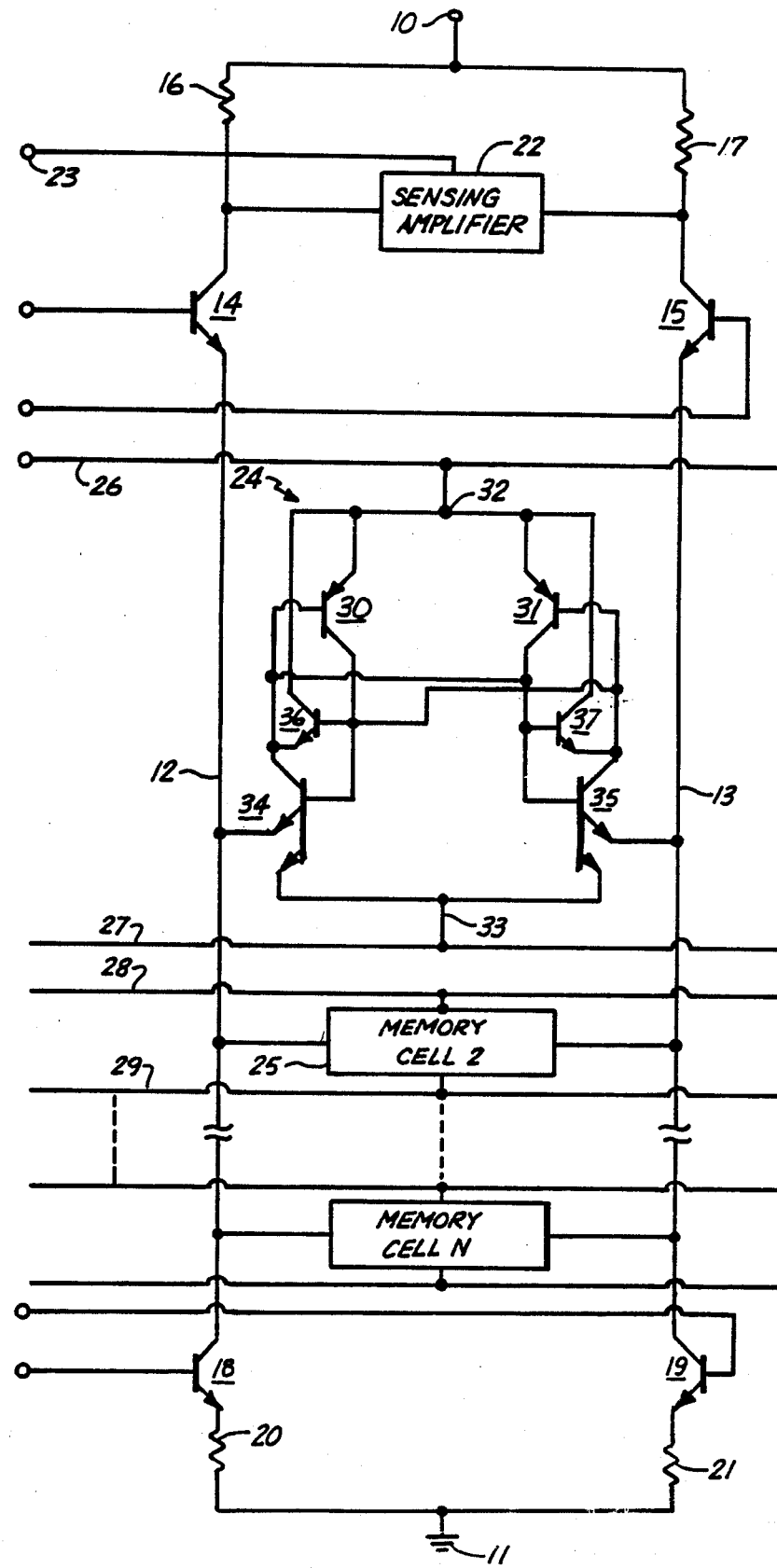
FIG. 1 shows an embodiment of the present invention in a larger circuit involving the invention.

FIG. 1 shows one of a plurality of bit column circuits in a bipolar transistor based random access memory. This bit column circuit operates between a positive voltage supply supplied to a terminal node, 10, adapted to be connected to such a source and a ground reference voltage at a further terminal, 11.

The bit column circuit of FIG. 1 has a pair of bit lines, 12 and 13, which each extend between two corresponding further bit line structures on the ends of each of these bit lines. Bit line 12 is connected to the emitter of an npn bipolar transistor, 14, serving as a first sensing amplifier multiplexing switch. A second such multiplexer switch npn bipolar transistor, 15, has its emitter connected to bit line 13. A sensing load resistor, 16, is electrically connected between the collector of transistor 14 and terminal 10. A similar sensing load resistor, 17, is connected between the collector of transistor 15 and again terminal 10. Further transistors, not shown, may also be connected to bit lines 12 and 13 for bit column selection from among other such columns under control of the address decoding circuitry.

The bases of transistors 14 and 15 are connected to multiplexing control signal generating and driver circuits, not shown. This circuitry is in turn under the direction of the input data provision circuit and the read or write selection circuits. Together these circuits are capable of applying differing voltage levels to the bases of transistors 14 and 15 in support of whatever information storing operation, information retrieving operation, or standby operation is desired in connection with the memory cells provided in the bit column circuit shown, as will be described below.

The lower ends of bit lines 12 and 13 are each connected to a corresponding current sink. The lower end of bit line 12 is connected to the collector of an npn bipolar transistor, 18, as part of its corresponding current sink. A similar npn bipolar transistor, 19, is provided having its collector connected to bit line 13. A current sink value setting resistor, 20, is electrically connected between the emitter of transistor 18 and ground reference terminal 11. Similarly, a current sink value setting resistor, 21, is connected between the emitter of transistor 19 and again ground reference terminal 11. The bases of transistors 18 and 19 are each connected to a reference voltage source.

A sensing amplifier, 22, is shown in FIG. 1 connected between the collectors of transistors 14 and 15. A number of alternative well-known sensing amplifier types can be suitably provided for this purpose, and so no circuit specifics are indicated in FIG. 1. The output from sensing amplifier 22 is provided at an output terminal, 23, extending therefrom.

Below sensing amplifier 22, and below transistors 14 and 15, in the bit column circuit of FIG. 1, between bit lines 12 and 13 thereof, are a series of N memory cells that are provided for information storage in this bit column circuit. One of these memory cells, 24, is shown as a complete circuit diagram. The next memory cell therebelow, 25, is shown only in block form as its circuit is identical to that of memory cell 24. The remaining memory cells in the bit column have been omitted altogether for space reasons, with the exception of the last one which is indicated to be memory cell N.

Each of these memory cells, including cells 24 and 25, operate between a word line interconnection and a standby line interconnection. These two lines, or interconnections, are operated together to provide electrical power to the corresponding memory cells in the bit column circuit as well as to corresponding memory cells in other bit column circuits. In the standby state, a reduced voltage is supplied to each word line and to the corresponding standby line to isolate a cell connected therebetween from signals on the bit lines connected thereto. In the active state in which information can be either stored or retrieved from the memory cell, as determined by the read and write select circuits, an increased voltage is supplied to the word line connected to that cell and to its corresponding standby line to permit such operations. These two lines for each memory cell are operated by the address decoding circuitry in other parts of the memory system, not shown here.

In the standby state, a standby line is typically operated at 1.3 V and its corresponding word line at 2.1 V, these being typical voltages assuming 5.0 volts being supplied to terminal 10. In the active state, the standby line will be switched to 2.5 V and the word line to 3.3 V, again typical voltages.

In regard to cell 24, a word line, 26, is connected in FIG. 1 to the upper circuit portion of cell 24, and a standby line, 27, is connected to the lower circuit portion thereof as drawn. Similarly, a word line, 28, is connected to the upper portion of memory cell 25 and a standby line, 29, is connected to the lower side thereof. The same arrangement holds for the other memory cells not shown and for the last cell as shown. Each word line and standby line pair connect to other memory cells in the same row in other bit column circuits, and also connect back to the driver circuits therefor operated by the memory address decoding circuitry.

Memory cell 24 has a pair of pnp bipolar transistors, 30 and 31, each having an emitter connected to the memory cell upper terminal, 32, which in turn is connected to word line 26 as suggested above. The lower terminal, 33, of memory cell 24 has an emitter connected thereto from each of a pair of npn bipolar transistors, 34 and 35.

The collector of transistor 34 is connected to the base of transistor 30, and the collector of transistor 30 is connected to the base of transistor 34. Similarly, the collector of transistor 31 is connected to the base of transistor 35, and the collector of transistor 35 is connected to the base of transistor 31. Thus, transistors 30 and 34 are connected in a positive feedback loop with each other, as are transistors 31 and 35 with each other. As a result, the switching into the "on" condition of one of the two transistors in either of these pairs switches the other into that same condition thereby driving each into saturation so that a substantial current can pass therethrough.

These two transistor pairs, 30 and 34 as one and 31 and 35 as the other, are cross-coupled in that the collector of each of the npn transistors 34 and 35 are connected to the base of the other. As a result, if the two transistors in one of the foregoing pairs are each in the "on" condition and in saturation, the transistors in the other pair are both in the "off" condition.

Transistors 34 and 35 each have a second emitter. The emitter of transistor 34 is connected to bit line 12, and the emitter of transistor 35 is connected to bit line 13. Thus, the selection of the bit column of FIG. 1 to be activated through operation of address decoding circuitry transistors, not shown as indicated above, can lead to the storing or retrieving of information from cell 24. However, this requires that its corresponding word line 26 and standby line 27 are also activated through increasing the voltage thereon as earlier described. This can be done without raising the voltage on word line 28 or standby line 29 for the second memory cell 25, or on the word lines or standby lines of the other memory cells, which, as a result, leaves them substantially unaffected by voltage changes on bit lines 12 and 13 applied through transistors 14 and 15.

A difficulty with either of the pair of transistors 30 and 34 in saturation mutually, or of the pair of transistors 31 and 35 in a similar condition, is the resulting additional time required to switch such transistors into the "off" condition because of the storage of minority charge carriers in the base regions thereof. The greater the current drive of each in saturation, the greater the number of charge carriers stored and so the slower the switching time.

Thus, a further pair of npn bipolar transistors, 36 and 37, are provided in memory cell 24. The emitter of transistor 36 is connected to the collector of transistor 34, and the base of transistor 36 is connected to the base of transistor 34. The emitter of transistor 37 is connected to the collector of transistor 35, and the base of transistor 37 is connected to the base of transistor 35. The collectors of each of transistors 36 and 37 are connected to upper terminal portion 32 of memory cell 24. The one of transistor pairs 30 and 36 (as well as transistor 34), or 31 and 37 (as well as transistor 35), in the "on" condition hold each member of the other pair in the "off" condition just as indicated above. Either transistors 30 and 34 or transistors 31 and 35 will be in saturation if "on", but the added transistors 36 and 37 are always either "off" or "on" without being in saturation.

Storing new information in memory cell 24 requires that standby line 27 be raised to 2.5 V approximately, and word line 26 be raised to 3.3 V approximately to select the row of memory cells containing memory cell 24. In addition, voltages must be applied to the bases of transistors 14 and 15 to operate memory cell 24 indicating whether a "1" or a "0" is to be stored therein. The one of bit lines 12 and 13 connected to transistors 34 and 35, respectively, that is to have the transistor in saturation connected thereto after such a storing is required to have a corresponding one of the multiplexer switching transistors 14 and 15 supplied with a relatively low voltage of typically 2.1 V on the base thereof. The remaining one of transistors 14 and 15 will have the bit line extending therefrom connected to an "off" condition transistor in memory cell 24. That remaining transistor should have a relatively large voltage thereon of typically 3.4 V supplied to its base.

Assume, because of performing a storing operation in memory cell 24, that transistors 31 and 35 are, as a result of such storing, each in the "on" condition. Transistors 30 and 34 are then correspondingly in the "off" condition. In order to achieve this condition, the base of transistor 15 is to be placed at 2.1 V, as indicated above, and the base of transistor 14 will be placed at 3.4 V.

Since the base voltage of transistor 35 will be higher than that of transistor 15 transistor 35 will begin to conduct, lowering the base voltage of transistor 34. Transistor 34 will switch to the "off" condition and all of the current demanded by the current sink having transistor 18 therein will be supplied by transistor 14. As a result, transistor 30 will be switched to the "off" condition as desired, allowing transistor 35 to switch transistor 31 into the "on" condition. Each will drive the other towards saturation because of the positive feedback loop they are in, completing the storage of new data. However, because of the presence of transistor 37, these transistors will not be driven into saturation nearly as far as they would be otherwise since transistor 37 can supply some of the current directly from terminal 32 which would have been required to be drawn through the base of transistor 31.

Transistor 37 will have its base-emitter junction forward biased as a result of transistor 35 being in saturation. The collector of transistor 35 will be within 50 millivolts or so of the voltage on lower terminal 33 of memory cell 24 so that nearly all of the base-emitter voltage across transistor 35 will also be across transistor 37. The greater the voltage rise across the base-emitter junction of transistor 35 to increase the current drive therethrough, the greater the voltage will be across the base-emitter junction of transistor 37 to provide a shunting current around transistor 31 to supply the demand for current at the collector of transistor 35. This will limit the current which needs to be provided through the base of transistor 31 which will keep from being as far into saturation. A corresponding smaller collector current will be supplied by transistor 31 to the base of transistor 35 to thereby keep transistor 35 less far into saturation.

Thus, both transistors 31 and 35 are driven less far into saturation because of the presence of transistor 37, and can therefore switch to the "off" condition faster during a subsequent storing operation in memory cell 24 of information requiring the opposite binary state in that cell. All of the current demanded by the current sink containing transistor 19 is thus supplied from word line 26 through the saturated transistors 31 and 35, and through transistor 37, which all passes out of the emitter of transistor 35 to bit line 13. In this situation, the voltage at the base of transistor 31 will be at approximately 2.5 V and the voltage at the collector of transistor 31 will be about 3.25 V.

Retrieving the information stored in memory cell 24 requires that the voltage at the base of each of multiplexing switching transistors 14 and 15 be set to 2.9 V approximately. Since the voltage on word line 26 remains at about 3.3 V, there still will be an insufficient difference between that voltage and the voltage on the emitter of transistor 34 connected to bit line 12 to switch any of transistors 30, 34 or 36 into the "on" condition. Thus, the current demanded by the current sink having transistor 18 therein will continue to be supplied by the current through transistor 14. This current causes a voltage drop across sensing load resistor 16.

The voltage occurring at the emitter of transistor 35 will be a base-emitter voltage drop less than the higher of the two voltages applied to the bases of transistors 15 and 35. Since there is approximately 3.25 V on the collector of transistor 31, and so on the base of transistor 35, compared to 2.9 V on the base of transistor 15, transistors 31, 35 and 37 will continue to be in the "on" condition and in saturation. Transistors 31 and 35 form, in effect, a silicon controlled rectifier in the "on" condition which is located between word line 26 and the collector of transistor 19 to provide current to bit line 13, with there additionally being a current shunt around a part of this combination. This shunt is provided by transistor 37 which, to an extent, reduces the current drawn through the base of transistor 31. The entire current demanded by the current sink having transistor 19 therein will thus be supplied from word line 26 through transistors 31, 37 and 35, and all of it passes out of an emitter of transistor 35 to bit line 13.

Hence, there will be no significant current through sensing load resistor 17. As a result, there will be a significant voltage difference between the leads from sensing amplifier 22 to resistor 16 and 17, and so across the inputs thereof, because of the current drawn through resistor 16 being supplied to the current sink containing transistor 18. This condition will be sensed by sensing amplifier 22 and a voltage appropriate to indicate the occurrance thereof will be provided on its output 23.

Transistors 30, 36 and 34 can, of course, be alternatively caused to go into the "on" condition and behave like a silicon controlled rectifier in the "on" condition, with transistors 31, 37 and 35 then being switched to the "off" condition. This is accomplished by switching the voltages applied to the bases of transistors 14 and 15 from what they were in the situation just described. That is, 3.4 V is to be supplied at the base of transistor 15 and 2.1 V is to be supplied at the base of transistor 14.

Varying from the circuit arrangement for the bit column so far described, memory cell 24 can be connected to bit lines 12 and 13 in alternative manners which do not use a second emitter in each of control transistors 34 and 35 in making such a connection. Thus, in the absence of these second emitters, alternative diode connections can be made to the collectors or to the bases of these control transistors with the memory cell operating in a manner much as before, though with the same disadvantages.

Figure 3:
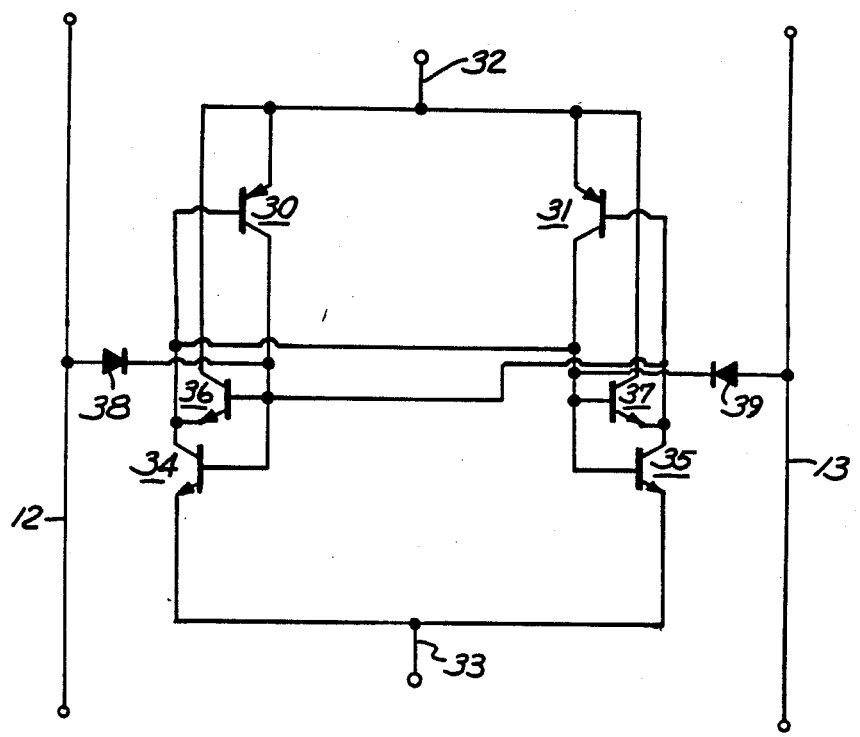
FIG. 3 an alternative embodiment of the present invention.

An alternative to the implementation shown in FIG. 1 is shown in FIG. 3 where a pair of diodes, 38 and 39, can be used for electrical connection from the memory cell bit lines. These diodes may preferably be Schottky diodes, or they may be pn junction diodes. Diode 38 has its cathode connected to the base of transistor 34 and its anode connected to bit line 12. Similarly, diode 39 has its cathode connected to the base of transistor 35 and its anode connected to bit line 13. The column circuitry would differ from that in FIG. 1 for this implementation. Data is stored in the memory cell by having the voltage of one of the bit lines 12 and 13 raised. Assuming the voltage for bit line 13 is raised, the current through diode 39 will switch transistor 30 into the "off" condition and switch transistor 35 into the "on" condition. Transistor 35 will be driven into saturation, as before, completing the storage of the new data. Retrieving information in a cell in a selected column is accomplished by resistively coupling bit lines 12 and 13 to a fixed voltage. The diode connected to the base of the "on" control transistor in the memory cell will carry less current than the other diode due to a lower voltage across the bit line resistor. A sensing amplifier is used to measure the difference in current to determine the state of the cell.

Figure 2:
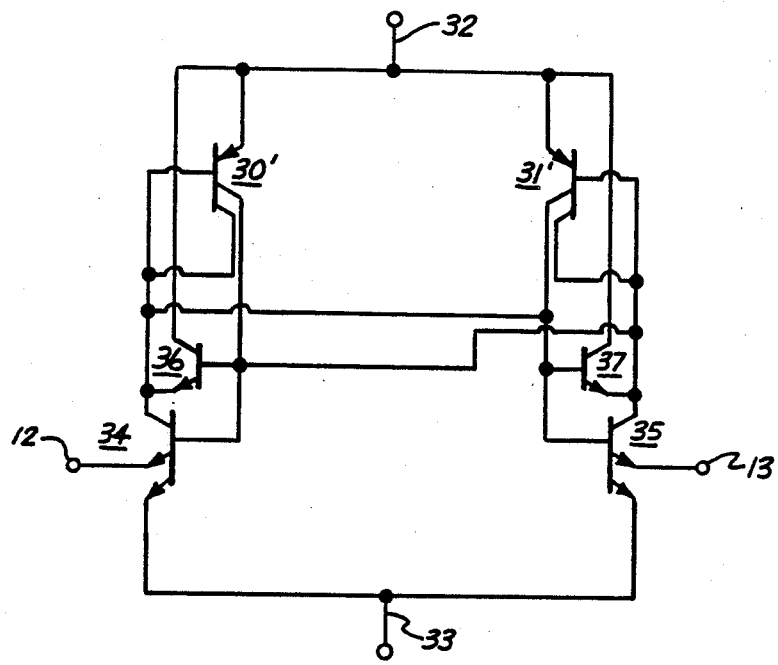
FIG. 2 shows an alternative embodiment of the present invention.

FIG. 2 shows a further and alternative embodiment of memory cell 24 of FIG. 1, using the same designations therein for components similar to those in the circuit of FIG. 1, and which assumes choosing the alternative of FIG. 1 using npn bipolar control transistors 34 and 35 with double emitters. The change here comes in substituting an altered pair of pnp bipolar transistors, 30' and 31', for transistors 30 and 31 in the circuit of FIG. 1. Transistors 30' and 31' each have a second collector added thereto which in turn is connected to the base thereof. Thus, the current still supplied by transistors 30' and 31' for the collector current of control transistors 34 and 35, beyond that supplied by transistors 36 and 37, has at least part thereof that is collector current from transistors 30' and 31' rather than being all base current therefrom.

This arrangement thus further reduces the degree of saturation of transistors 30' and 31'. Such an added reduction is helpful since these transistors are formed in monolithic integrated circuits as lateral bipolar transistors which inherently have poorer performance parameters than the vertical npn bipolar transistors. As a result, the lateral pnp bipolar transistors are relatively slow switching transistors, and so reducing their saturation to improve their switching rapidity acts to significantly reduce the switching time of the memory cell from one state to the other.

The rapidity of switching of the pnp bipolar transistors is controlled primarily by the diffusion capacitance thereof which is current dependent. Reducing the current therethrough thus reduces this diffusion capacitance and so the switching time required. In addition, reducing the saturation of these pnp bipolar transistors also reduces the forward bias on the parasitic pnp transistors involving the integrated circuit substrate and so lessens current losses therethrough.

In the standby mode for the system of FIG. 1, as indicated above, the voltage on word line 26 goes to around 2.1 V, and the voltage on standby line 27 goes to around 1.4 V. In these circumstances, the voltages occurring at the bases of transistors 14 and 15, in selecting another cell in the bit column of FIG. 1 for a storing or retrieval operation, are sufficiently high so that the emitters of transistors 34 and 35 in memory cell 24 connected to bit lines 12 and 13, respectively, are reverse biased with respect to the bases of these transistors. Thus, in this standby mode, no substantial current is drawn through the bit lines from any memory cell not selected in the bit column shown, including memory cell 24, if it is in this standby mode in FIG. 1.

On the other hand, the voltage at the base of each of transistors 34 and 35 will be such so that these transistors can operate in the inverse mode and actually draw current from a bit line connected to the "on" condition side of the memory cell which is kept in saturation in the standby mode. The addition of transistors 36 and 37, in each reducing the saturation of the pair of transistors with which it is associated if they are in the "on" condition, also leads to reducing the forward bias of transistors 34 or 35 in the inverse mode so as to reduce the amount of current drawn from the associated bit line in the standby mode.

In addition, the base-emitter junction of transistors 36 and 37, whichever one is in the "on" condition, will have a depletion capacitance. The base-collector junction of that transistor, and both the base-emitter and base-collectors of the remaining one of these transistors in the "off" condition, will all have depletion capacitances associated therewith. These depletion capacitances will act to maintain the circuit nodes between which they are connected at whatever voltage condition they are in. Thus, for instance, in the event of an impinging radiation particle tending to discharge such a node, these capacitances will provide the temporary charge necessary to replace the charge lost as a result of a radiation particle impact to thereby keep the circuit in its existing state and so prevent an unwanted switching between output states. In a cell activated by increasing the voltage on the word line and standby line associated therewith for a storing or retrieving operation, these additional capacitances in transistors 36 and 37 will be small compared to the diffusion capacitances of pnp bipolar transistors 30 and 31. As a result, they will not appreciably affect storing and retrieving operations in the memory cell.

Although the present invention has been described with reference to preferred embodiments, workers skilled in the art will recognize that changes may be made in form and detail without departing from the spirit and scope of the invention.

What is claimed is:

1. A memory cell circuit for electrical connection between a word line and a standby line to selectively provide electrical activation thereof, and for electrical connection between a pair of bit lines to permit selectively storing therein of, and retrieving therefrom, information, said memory cell circuit comprising:

a pair of load bipolar transistors each having an emitter electrically connected to said word line;

a pair of control bipolar transistors each having a collector thereof electrically connected to a base of one of said pair of load bipolar transistors and each having a base thereof electrically connected to a collector of that same one of said pair of load bipolar transistors, said pair of control bipolar transistors each having its said base electrically connected to that other's said collector and its emitter electrically connected to said standby line; and a pair of supplementary bipolar transistors each having a collector electrically connected to said word line, said pair of supplementary bipolar transistors each having a base electrically connected to a base of one of said pair of control bipolar transistors and each having an emitter electrically connected to a collector of that same one of said pair of control bipolar transistors.

2. The apparatus of claim 1 wherein said pair of load bipolar transistors are each a pnp bipolar transistor, said pair of control bipolar transistors are each an npn bipolar transistor, and said pair of supplementary bipolar transistors are each an npn bipolar transistor.

3. The apparatus of claim 1 wherein said pair of load bipolar transistors each has a second collector therein connected to its base.

4. The apparatus of claim 1 wherein said pair of control bipolar transistors each has another emitter by which it is electrically connected to a corresponding one of said bit lines.

5. The apparatus of claim 1 wherein said control bipolar transistors each have a collector electrically connected to a corresponding one of said bit lines.

6. The apparatus of claim 3 wherein said pair of control bipolar transistors each has another emitter by which it is electrically connected to a corresponding one of said bit lines.

7. The apparatus of claim 3 wherein said pair of control bipolar transistors each have a collector electrically connected to a corresponding one of said bit lines.

8. The apparatus of claim 7 wherein said electrical connection from a said control bipolar transistor to a said bit line is made through a diode.

9. The apparatus of claim 5 wherein said electrical connection from a said control bipolar transistor to a said bit line is made through a diode.

* * * * *